United States Patent
Song et al.

(10) Patent No.: US 9,318,643 B2
(45) Date of Patent: Apr. 19, 2016

(54) FABRICATION METHOD OF INVERTED SOLAR CELLS

(71) Applicant: XIAMEN SANAN OPTOELECTRONICS TECHNOLOGY CO., LTD., Xiamen (CN)

(72) Inventors: Minghui Song, Xiamen (CN); Guijiang Lin, Xiamen (CN); Zhihao Wu, Xiamen (CN); Liangjun Wang, Xiamen (CN); Jianqing Liu, Xiamen (CN); Jingfeng Bi, Xiamen (CN); Weiping Xiong, Xiamen (CN); Zhidong Lin, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 133 days.

(21) Appl. No.: 14/147,498

(22) Filed: Jan. 4, 2014

(65) Prior Publication Data

US 2014/0120656 A1 May 1, 2014

Related U.S. Application Data

(63) Continuation of application No. PCT/CN2012/078233, filed on Jul. 5, 2012.

(30) Foreign Application Priority Data

Jul. 7, 2011 (CN) .......................... 2011 1 0189612

(51) Int. Cl.
*H01L 31/18* (2006.01)
*H01L 31/0687* (2012.01)

(52) U.S. Cl.
CPC ...... *H01L 31/1844* (2013.01); *H01L 31/06875* (2013.01); *H01L 31/1892* (2013.01); *Y02E 10/544* (2013.01)

(58) Field of Classification Search
None
See application file for complete search history.

(56) References Cited

U.S. PATENT DOCUMENTS 4,980,204 A * 12/1990 Fujii et al. ........................ 117/98
5,403,916 A * 4/1995 Watanabe et al. ............... 438/26

(Continued)

OTHER PUBLICATIONS

J. Lammasniemi, et al., Characteristics of Indium Phosphide Solar Cells Bonded on Silicon, Photovoltaic Specialists Conference, 1993, Conference Record of the Twenty Third IEEE, May 10-14, 1993, p. 763-767.*

(Continued)

*Primary Examiner* — Charles Garber
*Assistant Examiner* — Alia Sabur
(74) *Attorney, Agent, or Firm* — Syncoda LLC; Feng Ma; Junjie Feng

(57) ABSTRACT

A fabrication method for an inverted solar cell includes: (1) providing a growth substrate; (2) depositing a SiO$_2$ mask layer over the surface of the growth substrate to form a patterned substrate; (3) forming a sacrificial layer with epitaxial growth over the patterned substrate, wherein the sacrificial layer encompasses the entire SiO$_2$ mask pattern; (4) forming a buffer layer over the sacrificial layer via epitaxial growth; (5) forming a semiconductor material layer sequence of the inverted solar cell over the buffer layer with epitaxial growth; (6) bonding the semiconductor material layer sequence of the inverted solar cell with a supporting substrate; (7) selectively etching the SiO$_2$ mask layer by wet etching; and (8) selectively etching the sacrificial layer by wet etching to lift off the growth substrate.

20 Claims, 8 Drawing Sheets

(56) References Cited

U.S. PATENT DOCUMENTS

| | | | |
|---|---|---|---|
| 5,919,305 A * | 7/1999 | Solomon | C30B 25/02 117/101 |
| 2008/0038857 A1* | 2/2008 | Kim et al. | 438/46 |
| 2009/0111205 A1* | 4/2009 | Lee | H01L 33/0079 438/46 |
| 2010/0105194 A1* | 4/2010 | Pan | 438/481 |
| 2010/0244074 A1* | 9/2010 | Oka et al. | 257/98 |
| 2010/0261300 A1* | 10/2010 | Tu et al. | 438/29 |

OTHER PUBLICATIONS

Processing and Properties of Compound Semiconductors, Willardson & Weber, Academic Press, Oct. 20, 2001.*

Merriam-Webster Dictionary, Encompass | Definition of encompass by Merriam Webster, http://www.merriam-webster.com/dictionary/encompass, accessed Oct. 26, 2015.*

* cited by examiner

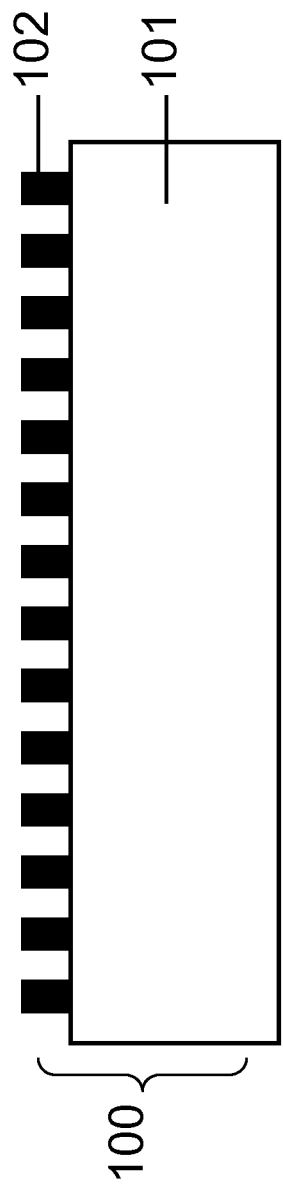
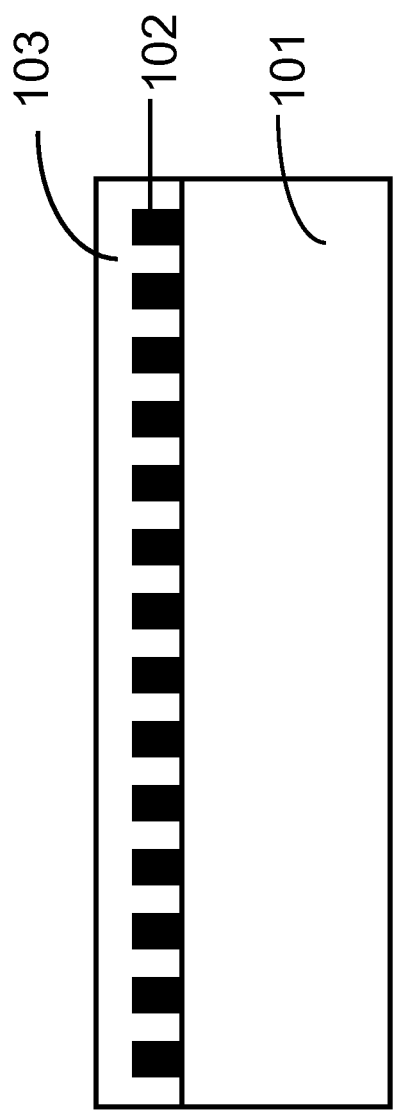

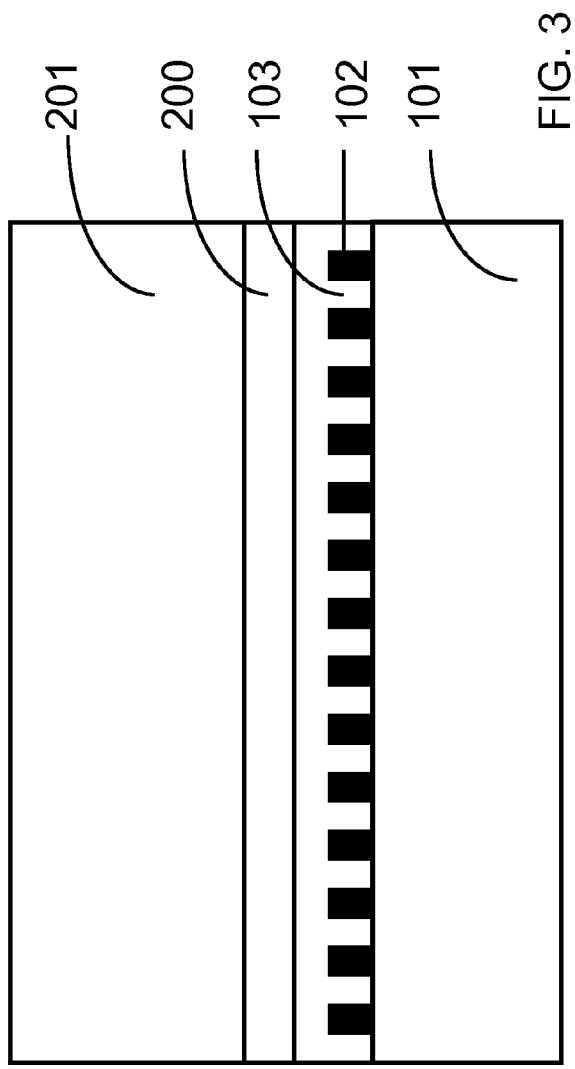
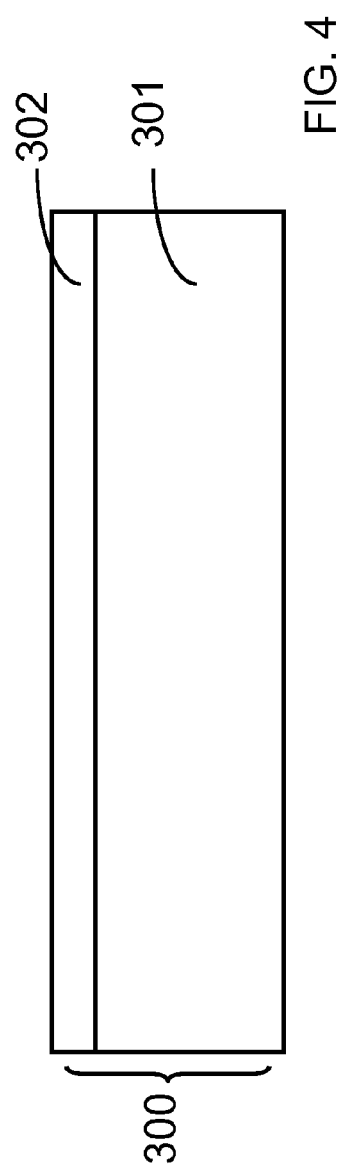

US 9,318,643 B2

FABRICATION METHOD OF INVERTED SOLAR CELLS

CROSS-REFERENCE TO RELATED APPLICATIONS

The present application is a continuation of, and claims priority to, PCT Application PCT/CN2012/078233, filed on Jul. 5, 2012 and published on Jan. 10, 2013 as publication WO 2013/004188 A1, which claims priority to Chinese Patent Application No. 201110189612.6 filed on Jul. 7, 2011, entitled "Method of Manufacturing Inverted Solar Cells." The disclosures of these applications are hereby incorporated by reference in their entirety.

BACKGROUND

Along with the development of concentrating photovoltaic technology (CPV) in recent years, solar cells of GaAs and related III-V group compounds have been attracting increasingly more attention due to their high photoelectric conversion efficiency. InGaP/GaAs/Ge triple-junction solar cells are widely adopted III-V group compound semiconductor multi junction solar cells. In these solar cells, the lattice constants of all subcells are substantially matched with each other. The widths of band gaps from top down are approximately 1.86 eV for InGaP, approximately 1.42 eV for GaAs, and approximately 0.78 eV for Ge, thus realizing an effective utilization of solar spectrum via a conversion efficiency (AM1.5) as high as 32% (as per American Spectrum Lab) and 41.6% under concentrated conditions. With band gap matching design, the conversion efficiency of the GaInP/GaAs/InGaAs inverted multi junction solar cell is up to 32% under AM0 and 1sun conditions and even more than 40% under high concentrated conditions (500×, AM1.5). In the photovoltaic industry, the substrate cost generally takes up 30-50% of the total solar cell cost and becomes one of the main factors for high prices of solar cells.

SUMMARY

The present disclosure relates to compound semiconductor solar cells, and more particularly, to a fabrication method for inverted solar cells for repeated usage of substrates. For example, some of the methods disclosed herein can realize more simple separation of inverted multi-junction solar cell to allow the substrates to be used multiple times.

In an aspect, a fabrication method for an inverted solar cell is provided, including: (1) providing a growth substrate; (2) depositing a $SiO_2$ mask layer over the surface of the growth substrate to form a patterned substrate; (3) forming a sacrificial layer with epitaxial growth over the patterned substrate, wherein the sacrificial layer encompasses the entire $SiO_2$ mask pattern; (4) forming a buffer layer over the sacrificial layer via epitaxial growth; (5) forming a semiconductor material layer sequence of the inverted solar cell over the buffer layer with epitaxial growth; (6) bonding the semiconductor material layer sequence of the inverted solar cell with a supporting substrate; (7) selectively etching the $SiO_2$ mask layer by wet etching; and (8) selectively etching the sacrificial layer by wet etching to lift off the growth substrate.

In some embodiments, the material of the growth substrate in step (1) is Ge or GaAs.

In some embodiments, the pattern of the $SiO_2$ mask layer in step (2) includes at least one of a single-direction parallel pattern, a crisscrossing pattern, or inter-crossing pattern.

In some embodiments, the material of the sacrificial layer in step (3) is InGaP.

In some embodiments, the material of the sacrificial layer in step (3) is AlGaAs.

In some embodiments, the supporting substrate in step (6) is a Si wafer.

In some embodiments, the step (6) includes: depositing a first metal bonding layer over the semiconductor material layer of the inverted solar cell; providing a Si wafer as the supporting substrate and forming a cover layer of high doping level over the surface thereof; depositing a second metal bonding layer over the cover layer; bonding the semiconductor material layer sequence of inverted solar cell with the Si wafer; wherein the material of the cover layer is InGaAs or GaAs.

In some embodiments, hydrofluoric acid is used to selectively etch the $SiO_2$ mask layer in step (7).

In some embodiments, ammonium fluoride is used to selectively etch the $SiO_2$ mask layer in step (7).

In some embodiments, a selective etching solution of hydrochloric acid and phosphoric acid at a volumetric ratio of 1:2 is used to selectively etch the sacrificial layer in step (8).

In some embodiments, the method further includes: cleaning the patterned substrate and disposing the patterned substrate into a MOCVD reaction chamber.

In some embodiments, a pressure of the MOCVD chamber is controlled at about 300 Torr.

In some embodiments, an epitaxial growth rate is controlled to be about 1 Å/s.

In some embodiments, the method further includes baking the patterned substrate under a temperature of about 750° C. for about 10 minutes.

In some embodiments, the method further includes lowering the temperature to about 650° C.

In some embodiments, the method further includes forming a $Ga_{0.5}In_{0.5}P$ sacrificial layer of about 150 nm thickness using a lateral epitaxial growth process In some embodiments, the $Ga_{0.5}In_{0.5}P$ sacrificial layer encompasses the entire $SiO_2$ mask layer.

In some embodiments, the method further includes adjusting the pressure of MOCVD reaction chamber to about 30 Torr.

In some embodiments, the method further includes controlling a molar flow rate of V-III group reaction source to be about 40.

In some embodiments, the method further includes growing a GaAs buffer layer over the $Ga_{0.5}In_{0.5}P$ sacrificial layer.

Some of the disclosed embodiments adopt $SiO_2$ as the mask layer, and selectively etch the $SiO_2$ mask layer to generate many pores in the sacrificial layer with wet etching, thus increasing the contact area between the selective etching solution for sacrificial layer removal and the sacrificial layer, increasing the etching rate of the sacrificial layer, and reducing the difficulty in lifting off the substrates. Furthermore, some of the disclosed embodiments can complete the separation of the inverted multi junction solar cell and the substrate in a simpler way, realizing repeated usage of substrates, thereby reducing the production cost of solar cells.

BRIEF DESCRIPTION OF THE DRAWINGS

FIGS. 1-7 are schematic diagrams of a fabrication process of inverted solar cells according to some embodiments.

Figure 5:
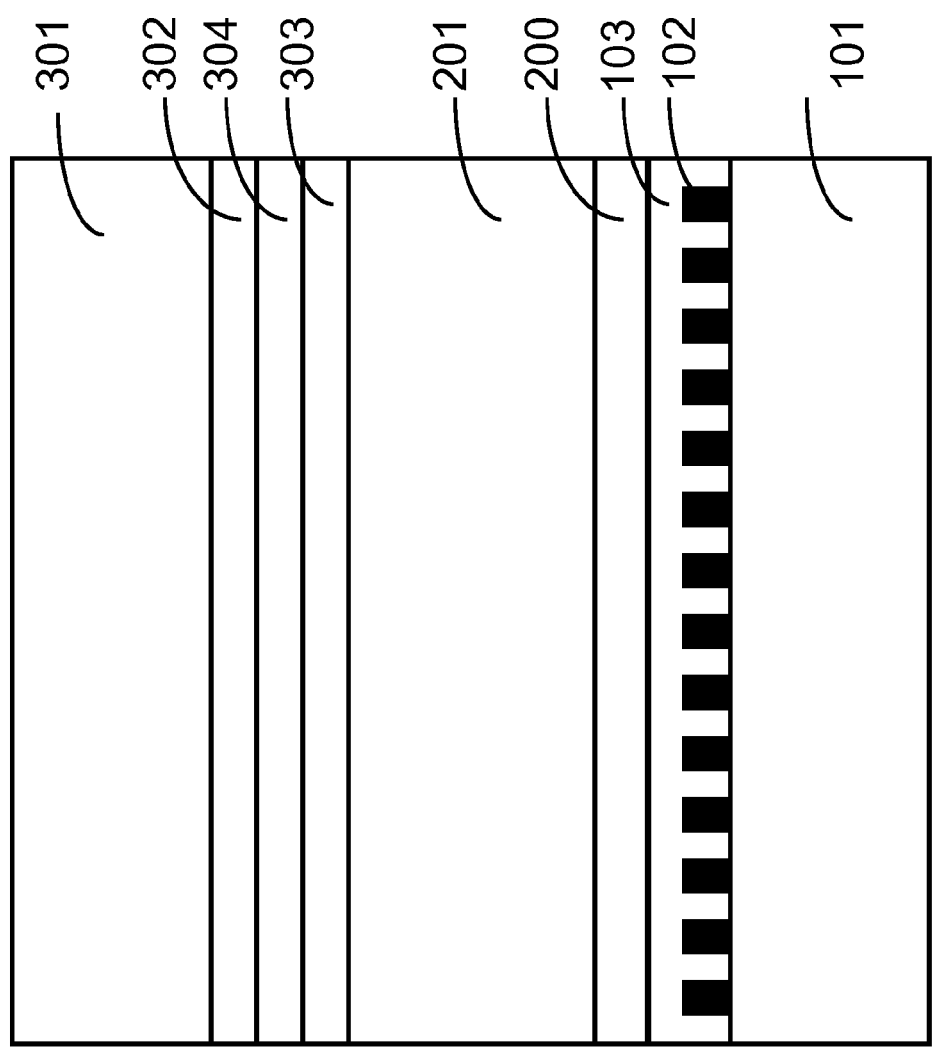

In the drawings: 100: patterned substrate; 101: growth substrate; 102: $SiO_2$ mask layer; 103: sacrificial layer; 104:

pore; 200: GaAs buffer layer; 201: semiconductor material layer sequence of an inverted solar cell; 300: supporting substrate; 301: p-type Si wafer; 302: p-type GaAs cover layer; 303: first metal bonding layer; 304: second metal bonding layer.

DETAILED DESCRIPTION

The embodiments of the present disclosure will be described in detail with reference to the accompanying drawings and examples, to help understand and practice the disclosed embodiments, regarding how to solve technical problems using technical approaches for achieving the technical effects.

In traditional substrate lift-off processes, the substrate is separated from the cell by taking advantage of a selective etching feature of a sacrificial layer against a buffer layer and the substrate when certain etching solution is used. During the etching, the etching solution only etches selectively the sacrificial layer without etching the buffer layer and the substrate, thereby attaining the goal of the separation of the substrate and the cell. Due to the limited contact area between the selective etching solution and the sacrificial layer, a certain degree of force is typically applied on the cell structure in the traditional lift-off process to gradually increase the contact area between the selective etching solution and the sacrificial layer during the etching process. However, the applied force may damage the cell structure of the fragile material, thus limiting the large-scale application.

A fabrication method for inverted solar cells may include a patterned substrate formation process, a formation process of a semiconductor material layer sequence of the inverted solar cells, a supporting substrate bonding process, and a growth substrate lift-off process. In the following, detailed descriptions will be given with reference to FIGS. 1-7.

In a first step, select a growth substrate 101, which can be Ge or GaAs. In this embodiment, the growth substrate 101 is selected to be a GaAs substrate.

Figure 8:
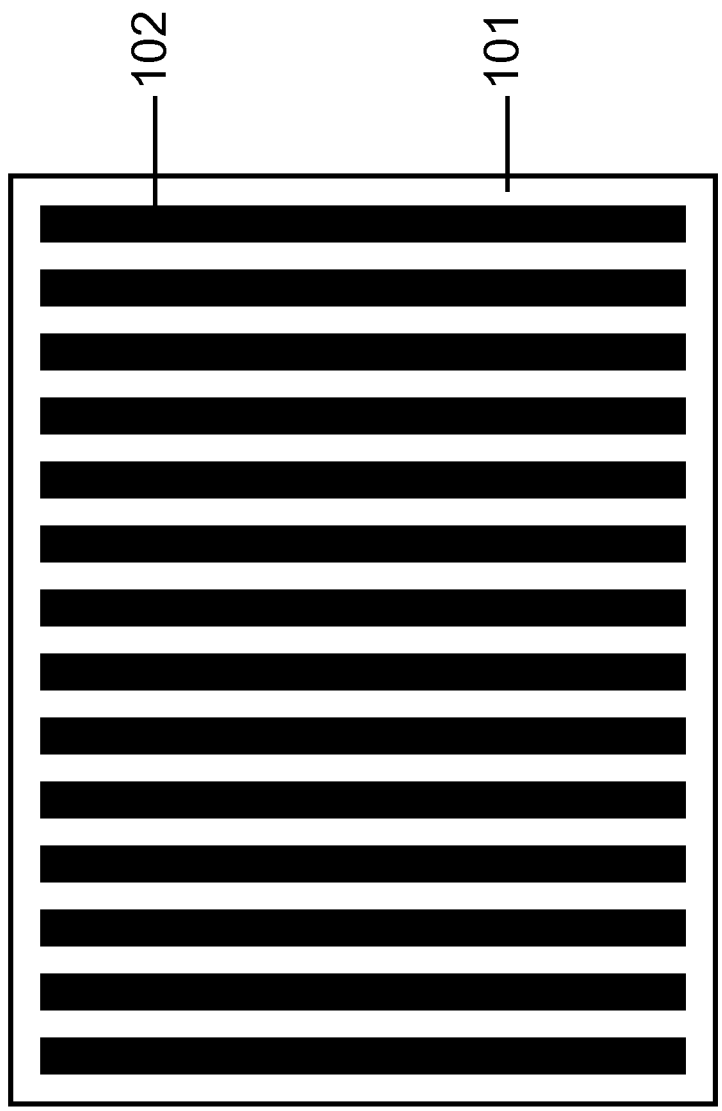
FIGS. 8-10 are top views of $SiO_2$ mask patterns according to some embodiments.
Figure 9:
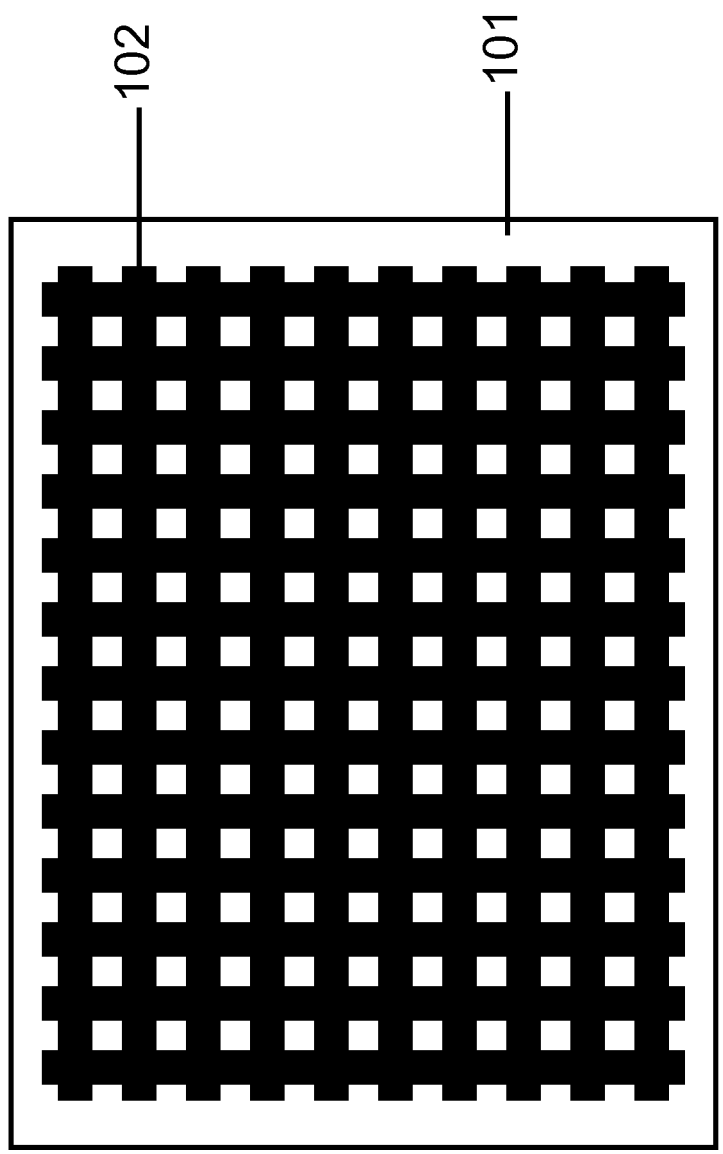
Figure 10:
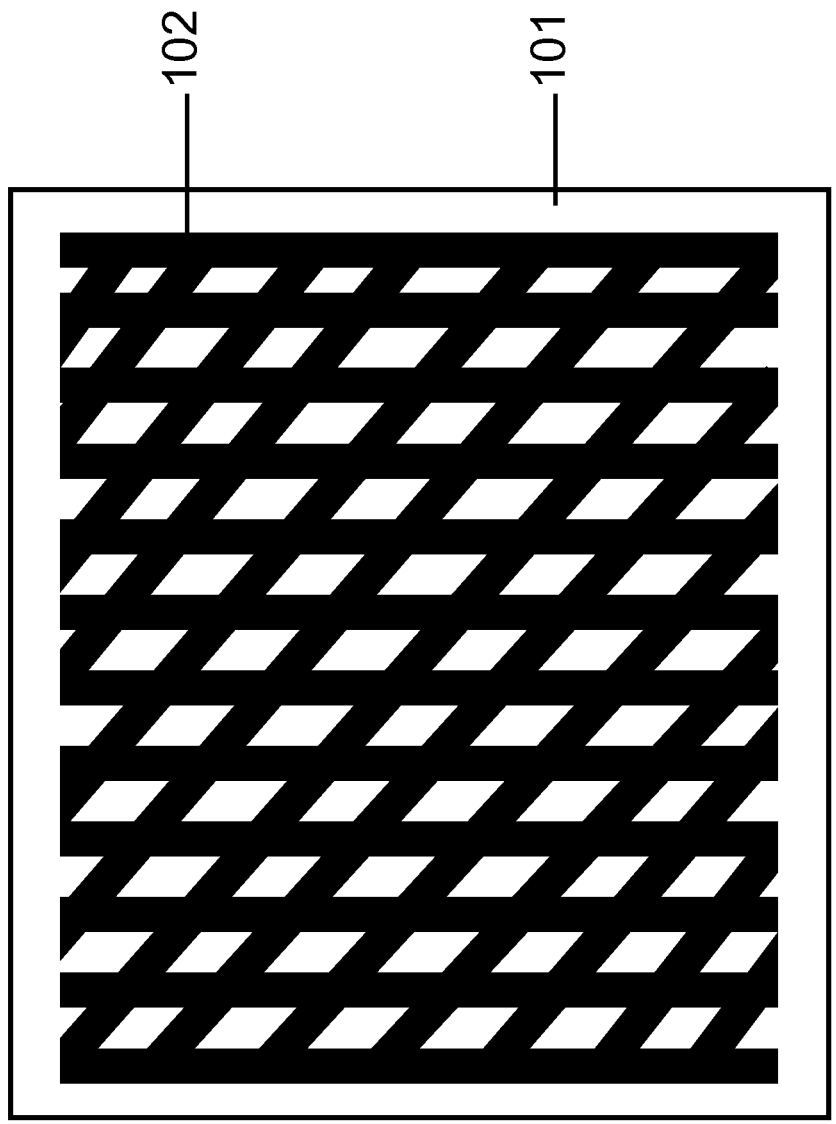

In a second step, fabricate a $SiO_2$ mask layer 102 over the growth substrate 101 to form a patterned substrate 100. More specifically, deposit a $SiO_2$ mask layer 102 of about 100 nm thickness over the GaAs substrate 101 using PECVD; fabricate a photoresist mask pattern on the $SiO_2$ mask layer 102 using a semiconductor etching process; and selectively etch the $SiO_2$ mask layer by wet etching; wherein the etching solution can be hydrofluoric acid or ammonium fluoride. In this embodiment, the etching solution is the hydrofluoric acid. First, selectively etch for 30 seconds, and then use deionized water for 10 minutes of flushing. Lastly, form a $SiO_2$ mask pattern on the GaAs substrate with a photoresist removal process. As shown in FIG. 1, the $SiO_2$ mask is uniformly distributed on the surface of the growth substrate 101, and a portion of the growth substrate surface is exposed. The $SiO_2$ mask pattern can be single-direction parallel, crisscrossing, or crossing each other. FIG. 8 shows the single-direction parallel pattern of the $SiO_2$ mask layer 102; FIG. 9 shows the crisscrossing pattern of the $SiO_2$ mask layer 102; and FIG. 10 shows the inter-crossing pattern of the $SiO_2$ mask layer 102.

In a third step, form a sacrificial layer 103 over the patterned substrate 100 through epitaxial growth. In this embodiment, $Ga_{0.5}In_{0.5}P$ is selected as the material of the sacrificial layer 103. More specifically, clean the patterned GaAs substrate 100 and dispose it into a MOCVD reaction chamber, with pressure of the reaction chamber controlled at 300 Torr. The epitaxial growth rate is about 1 Å/s. First, bake the substrate under 750° C. for 10 minutes, and lower the temperature to 650° C. Form a $Ga_{0.5}In_{0.5}P$ sacrificial layer 103 of about 150 nm thickness using a lateral epitaxial growth process. As shown in FIG. 2, the $Ga_{0.5}In_{0.5}P$ sacrificial layer 103 encompasses the entire $SiO_2$ mask layer 102.

In a fourth step, form a buffer layer 200 via epitaxial growth over the sacrificial layer 103. In this embodiment, GaAs is selected as the material of the buffer layer 200. Specific processes may include adjusting the pressure of MOCVD reaction chamber to about 30 Torr, a molar flow rate of V-III group reaction source of about 40, and growing a GaAs buffer layer 200 over the $Ga_{0.5}In_{0.5}P$ sacrificial layer 103.

In a fifth step, form a semiconductor material layer sequence of inverted solar cells over the sacrificial layer 103 via epitaxial growth. The solar cells can be single-junction or multi-junction. In this embodiment, an inverted triple-junction solar cell is selected. As shown in FIG. 3, grow a $Ga_{0.5}In_{0.5}P/GaAs/Ga_{0.7}In_{0.3}As$ semiconductor material layer sequence 201 of the inverted triple-junction solar cell on the GaAs buffer layer 200 via epitaxial growth.

In a sixth step, prepare a supporting substrate 300 for supporting the semiconductor material layer of the solar cell. The supporting substrate 300 can be a material with relatively good heat dissipation, such as Si wafer or ceramic substrate. In this embodiment, a p-type Si wafer 301 is selected as the supporting substrate. A p-type GaAs cover layer 302 with a high doping level is formed over the surface of the supporting substrate via epitaxial growth by way of MOCVD. The doping concentration of the p-type GaAs cover layer 302 can be about $1 \times 10^{19}/cm^3$ and the surface roughness can be about 3 nm.

In a seventh step, bond the semiconductor material layer sequence of the inverted solar cell with the supporting substrate. First, form a metal bonding layer over the surface of the semiconductor material layer sequence 201 of the inverted solar cell and the surface of the p-type GaAs cover layer 302, respectively. Next, bond the supporting substrate 300 and the semiconductor material layer sequence 201 of the inverted solar cell using a bonding process. The bonding material can be a conductive material such gold, gold-tin alloy, or indium. In this embodiment, gold is selected as the material of the bonding layer. Specific processes may include: through a metal vapor deposition process, first vapor-depositing an Au layer of about 400 nm thickness as a first metal bonding layer 303 over the surface of the $Ga_{0.5}In_{0.5}P/GaAs/Ga_{0.7}In_{0.3}As$ semiconductor material layer sequence 201 of the inverted triple-junction solar cell; and then vapor-depositing another Au layer of about 400 nm thickness as a second metal bonding layer 304 over the surface of the p-type GaAs cover layer 302; next, through an Au—Au bonding process, bond the supporting substrate 300 with the $Ga_{0.5}In_{0.5}P/GaAs/Ga_{0.7}In_{0.3}As$ semiconductor material layer sequence 201 of the inverted triple-junction solar cell. FIG. 5 shows a side sectional view of the solar cell after bonding process.

Figure 6:
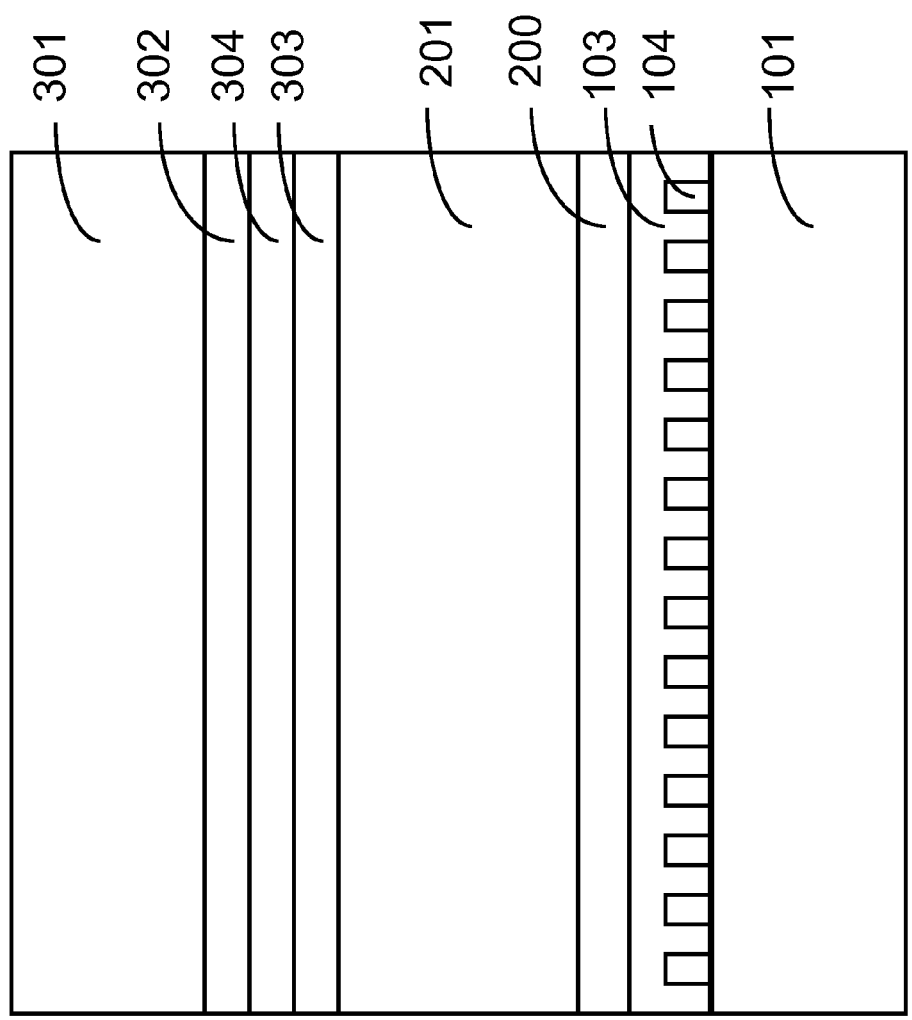
Figure 7:
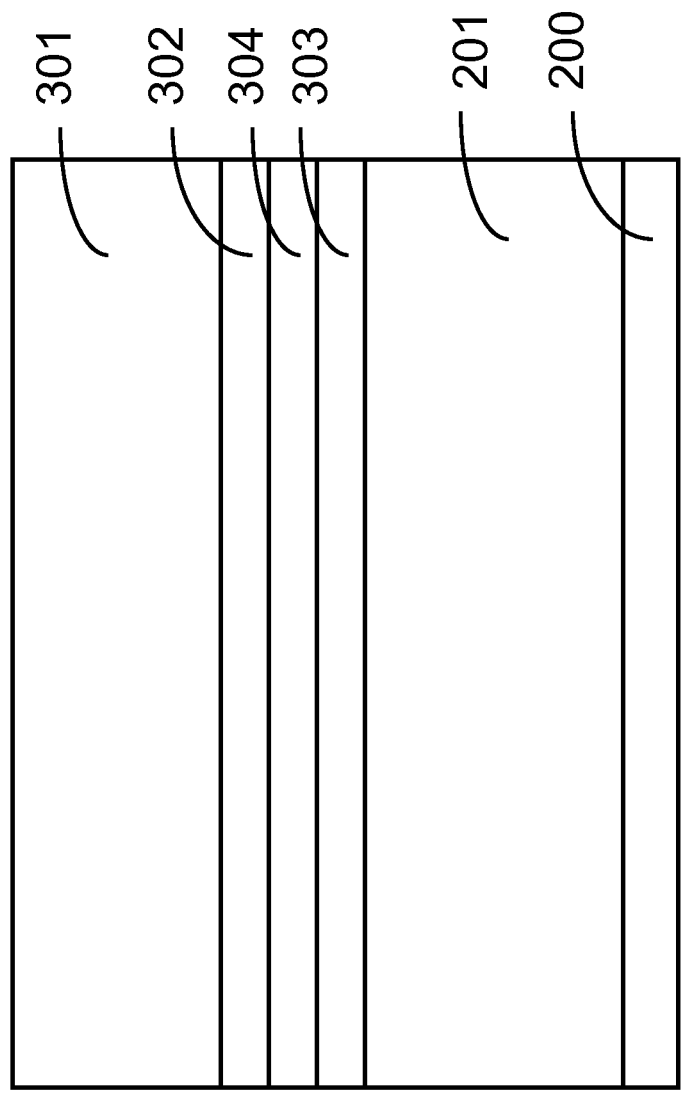

In an eighth step, lift off the patterned growth substrate 100, including removal of the $SiO_2$ mask layer 102 and the sacrificial layer 103. Selectively etch the $SiO_2$ mask layer 102 and the sacrificial layer 103 using a wet etching process, wherein the etching solution for the $SiO_2$ mask layer 102 can be hydrofluoric acid or ammonium fluoride; and the etching solution for the sacrificial layer 103 can be concentrated hydrochloric acid or a mixed solution of hydrochloric acid and phosphoric acid, etc. In this embodiment, hydrofluoric acid is selected as the etching solution for the $SiO_2$ mask layer 102, and a mixed solution of hydrochloric acid and phosphoric acid is selected as the etching solution for the sacrificial layer 103. Specific processes may include: first, use a 20% hydrofluoric acid to selectively etch the $SiO_2$ mask layer 102, as shown in FIG. 6, to generate many pores 104 in the $Ga_{0.5}In_{0.5}P$ sacrificial layer 103; and use the selective etching solution of hydrochloric acid and the phosphoric acid at a volumetric ratio of 1:2 to selectively etch the $Ga_{0.5}In_{0.5}P$ sacrificial layer 103. In this way, the GaAs substrate 101 can be completely lifted off. Clean the surface of the lifted-off GaAs substrate with deionized water and dry the substrate with a nitrogen gas gun, thus realizing repeated usage of the substrate.

In this embodiment, $SiO_2$ is selected as the mask layer. Subsequently, wet etching can be used to selectively etch the $SiO_2$ mask layer and to generate many pores in the sacrificial layer, thereby increasing the contact area between the selective etching solution for sacrificial layer removal and the sacrificial layer, improving the etching rate of the sacrificial layer, reducing the difficulty in the substrate lift-off, realizing repeated usage of the substrate, and reducing the production cost of the solar cells. Furthermore, this embodiment adopts a Si wafer as the supporting substrate, which has characteristics such as good heat dissipation, low cost, and ease of chip processing in later stages. An (In)GaAs cover layer is formed over the Si wafer surface, and is used in the metal bonding process with the inverted structural multi junction solar cells, thus improving the uniformity of bonding, reducing the impact of interfacial stress at interfaces on the cells, and increasing the product yield.

The invention claimed is:

1. A fabrication method for an inverted solar cell, comprising:
   (1) providing a growth substrate;
   (2) depositing a $SiO_2$ mask layer over the surface of the growth substrate to form a patterned substrate;
   (3) forming a sacrificial layer with epitaxial growth over the patterned substrate, wherein the sacrificial layer surrounds the entire $SiO_2$ mask layer;
   (4) forming a buffer layer over the sacrificial layer via epitaxial growth;
   (5) forming a semiconductor material layer sequence of the inverted solar cell over the buffer layer with epitaxial growth;
   (6) bonding the semiconductor material layer sequence of the inverted solar cell with a supporting substrate;
   (7) selectively etching the $SiO_2$ mask layer by wet etching; and
   (8) selectively etching the sacrificial layer by wet etching to lift off the growth substrate.

2. The fabrication method according to claim 1, wherein the material of the growth substrate in step (1) is Ge or GaAs.

3. The fabrication method according to claim 1, wherein the pattern of the $SiO_2$ mask layer in step (2) comprises at least one of a single-direction parallel pattern, a crisscrossing pattern, or an inter-crossing pattern.

4. The fabrication method according to claim 1, wherein the material of the sacrificial layer in step (3) is InGaP.

5. The fabrication method according to claim 1, wherein the material of the sacrificial layer in step (3) is AlGaAs.

6. The fabrication method according to claim 1, wherein the supporting substrate in step (6) is a Si wafer.

7. The fabrication method claim 1, wherein the step (6) comprises:
   depositing a first metal bonding layer over the semiconductor material layer sequence of the inverted solar cell;
   providing a Si wafer as the supporting substrate and forming a cover layer of high doping level over the surface thereof;
   depositing a second metal bonding layer over the cover layer;
   bonding the semiconductor material layer sequence of inverted solar cell with the Si wafer;
   wherein the material of the cover layer is InGaAs or GaAs.

8. The fabrication method according to claim 1, wherein hydrofluoric acid is used to selectively etch the $SiO_2$ mask layer in step (7).

9. The fabrication method according to claim 1, wherein ammonium fluoride is used to selectively etch the $SiO_2$ mask layer in step (7).

10. The fabrication method according to claim 1, wherein a selective etching solution of hydrochloric acid and phosphoric acid at a volumetric ratio of 1:2 is used to selectively etch the sacrificial layer in step (8).

11. The fabrication method according to claim 1, further comprising: cleaning the patterned substrate and disposing the patterned substrate into a MOCVD reaction chamber.

12. The fabrication method according to claim 11, wherein a pressure of the MOCVD chamber is controlled at about 300 Torr.

13. The fabrication method according to claim 12, wherein an epitaxial growth rate is controlled to be about 1 Å/s.

14. The fabrication method according to claim 13, further comprising: baking the patterned substrate under a temperature of about 750° C. for about 10 minutes.

15. The fabrication method according to claim 14, further comprising: lowering the temperature to about 650° C.

16. The fabrication method according to claim 15, further comprising: forming a $Ga_{0.5}In_{0.5}P$ sacrificial layer of about 150 nm thickness using a lateral epitaxial growth process.

17. The fabrication method according to claim 16, wherein the $Ga_{0.5}In_{0.5}P$ sacrificial layer encloses the entire $SiO_2$ mask layer.

18. The fabrication method according to claim 17, further comprising: adjusting the pressure of MOCVD reaction chamber to about 30 Torr.

19. The fabrication method according to claim 18, further comprising: controlling a molar flow rate of V-III group reaction source to be about 40.

20. The fabrication method according to claim 19, further comprising: growing a GaAs buffer layer over the $Ga_{0.5}In_{0.5}P$ sacrificial layer.

* * * * *